(12) United States Patent
Jung

(10) Patent No.: US 7,297,624 B2
(45) Date of Patent: Nov. 20, 2007

(54) SEMICONDUCTOR DEVICE AND METHOD FOR FABRICATING THE SAME

(75) Inventor: Meng An Jung, Eumsung-gun (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/024,701

(22) Filed: Dec. 30, 2004

(65) Prior Publication Data

US 2006/0055047 A1    Mar. 16, 2006

(30) Foreign Application Priority Data

Sep. 15, 2004    (KR) .............. 10-2004-0073723

(51) Int. Cl.
*H01L 21/44* (2006.01)
(52) U.S. Cl. .............. 438/597; 438/106; 438/111; 438/113; 438/460; 438/597; 438/675; 438/459; 438/462; 257/E21.502
(58) Field of Classification Search ............ None
See application file for complete search history.

(56) References Cited

U.S. PATENT DOCUMENTS 6,001,671 A * 12/1999 Fjelstad .............. 438/112
2004/0080040 A1 * 4/2004 Dotta et al. .............. 257/698

OTHER PUBLICATIONS http://www.answers.com/dielectric*

* cited by examiner

*Primary Examiner*—Michael Lebentritt
*Assistant Examiner*—Kyoung Lee
(74) *Attorney, Agent, or Firm*—Lowe Hauptman Ham & Berner LLP

(57) ABSTRACT

A method for fabricating a semiconductor device including forming a depression in a front surface of a semiconductor substrate, forming an electrode pad within the depression, forming structures including circuit devices and metal wires on the front surface of the semiconductor substrate, and exposing the electrode pad by removing a rear surface of the semiconductor substrate.

11 Claims, 6 Drawing Sheets

SEMICONDUCTOR DEVICE AND METHOD FOR FABRICATING THE SAME

BACKGROUND OF THE INVENTION

1. Field of the Invention

The present invention relates to a method for fabricating a semiconductor device, and more particularly, to a semiconductor device and a method for fabricating the same minimizing the size of a product after a packaging process.

2. Discussion of the Related Art

Generally, a method for fabricating a semiconductor device includes a fabrication process for forming a plurality of chips. A conventional process typically includes forming each chip with a circuit device by forming a minute pattern on a silicon wafer, a packaging process for providing electricity to individual chips of the silicon wafer, and sawing and packaging the individual chips.

In the fabrication process for the semiconductor device, after the circuit device designed with various metals is formed on the silicon wafer, a nitride layer or an oxide layer is coated thereon so as to protect the chips. The nitride or oxide layer protects the wafer from external pollution sources and prevents the metals from corroding. However, it is necessary to expose an electrode pad for connection with an external power source. In this case, the nitride layer or the oxide layer is partially removed by photolithography, thereby exposing the electrode pad.

In the packaging process for the semiconductor device, the semiconductor chip is supported by a lead frame. The chip is mounted on an external substrate such as a printed circuit board PCB, whereby the semiconductor chip is connected with the external substrate.

At this time, the electric connection for providing the power to the electrode pad of the semiconductor chip is classified into various methods. Among the various methods, a wire bonding method is most widely used, in which the electrode pad of the semiconductor chip is connected with the lead frame by a fine metal wire.

A method for fabricating the related art semiconductor device will be described with reference to FIG. 1A to FIG. 1E.

First, as shown in FIG. 1A, after structures 2, including various circuit devices and metal wires electrically connecting the various circuits to one another, are formed on a semiconductor substrate 1, an electrode pad 3 is formed. A nitride layer 4 is coated thereon. The nitride layer 4 serves as a protective layer.

As shown in FIG. 1B, a photoresist pattern 5 is formed on the nitride layer 4. As shown in FIG. 1C, by etching the exposed nitride layer 4 using the photoresist pattern 5 as a mask, the electrode pattern 3 is exposed. The photoresist pattern 5 is removed.

After back-grinding the semiconductor substrate 1 a distance $t_1$, as shown in FIG. 1D, the electrode pad 3 is connected with a lead frame by a wire 6 as shown in FIG. 1E.

In the aforementioned method, the process for exposing the electrode pad to the external power source is very complicated. Also, when exposing the electrode pad, the electrode pad may be corroded due to chemicals, which may cause a problem in the wire bonding process. In addition, the electrode pad may be easily contaminated by external pollution sources.

Further, when performing the wire bonding process, the lead frame is twice or more as large as the semiconductor chip. In this respect, it is inevitably required to fabricate the small-sized product.

SUMMARY OF THE INVENTION

Accordingly, the present invention is directed to a semiconductor device and a method for fabricating the same that substantially obviates one or more problems due to limitations and disadvantages of the related art.

The present invention advantageously provides a semiconductor device and a method for fabricating the same to prevent an electrode pad from being contaminated.

The present invention minimizes the size of a packaged product.

Additional advantages, objects, and features of the invention will be set forth in part in the description which follows and in part will become apparent to those having ordinary skill in the art upon examination of the following. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a semiconductor device includes structures including circuit devices and metal wires on a front surface of a semiconductor substrate, and an electrode pad formed by forming a depression in the front surface of the semiconductor substrate, filling the depression with a pad pattern, and removing a rear surface of the semiconductor substrate, wherein the electrode pad is exposed in the rear surface of the semiconductor substrate.

The electrode pad is exposed by chemically and mechanically polishing the rear surface of the semiconductor substrate to have the same height as the rear surface of the semiconductor substrate.

In another aspect, a method for fabricating a semiconductor device includes steps of forming a depression in a front surface of a semiconductor substrate, forming an electrode pad within the depression, forming structures including circuit devices and metal wires on the front surface of the semiconductor substrate, and exposing the electrode pad by removing a rear surface of the semiconductor substrate.

At this time, the depression has a depth of 300 µm to 600 µm.

Also, when removing the rear surface of the semiconductor substrate, the rear surface of the semiconductor substrate is chemically and mechanically polished until the electrode pad is exposed, to smooth the surface of the electrode pad to the rear surface of the semiconductor substrate.

Furthermore, the method includes a step of forming a protective layer for the electrode pad on the front surface of the semiconductor substrate after forming the electrode pad.

It is to be understood that both the foregoing general description and the following detailed description of the present invention are exemplary, but are not restrictive of the invention.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to exemplary embodiments of the present invention which are illustrated in the accompanying drawings. Wherever possible, the same reference numbers will be used throughout the drawings to refer to the same or like parts.

Hereinafter, a semiconductor device and a method for fabricating the same according to the present invention will be described as follows.

A fabrication method of a semiconductor device includes a fabrication process for forming a circuit device by forming a minute pattern in a silicon wafer, a packaging process for providing electricity to individual chips of the silicon wafer of the circuit device, and sawing and packaging the individual chips. In the present invention, the fabrication process is simplified by simplifying an electrode pad formation process. The size of product is minimized after the packaging process.

Figure 1A:
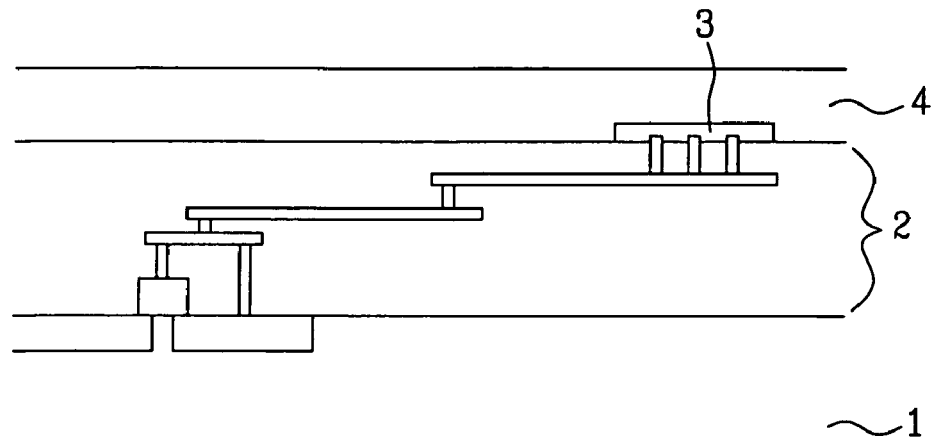
FIG. 1A to FIG. 1E are cross sectional views of the fabrication process for a semiconductor device according to the related art.
Figure 1B:
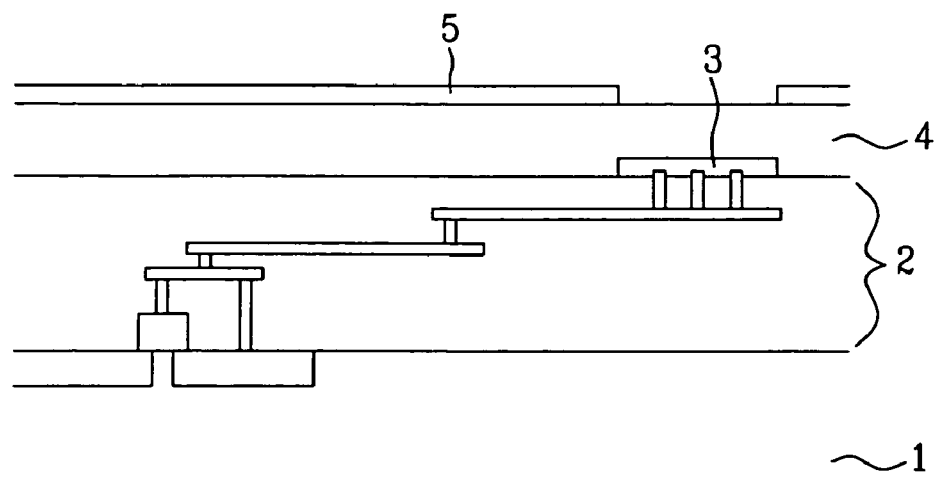
Figure 1C:
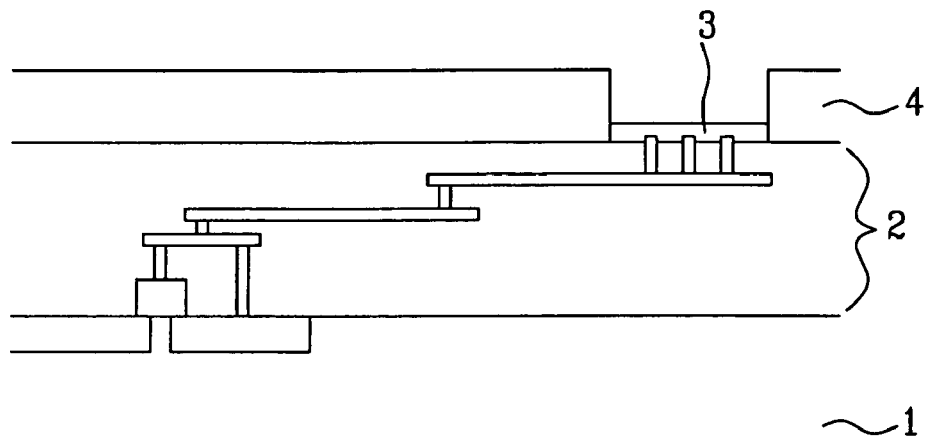
Figure 1D:
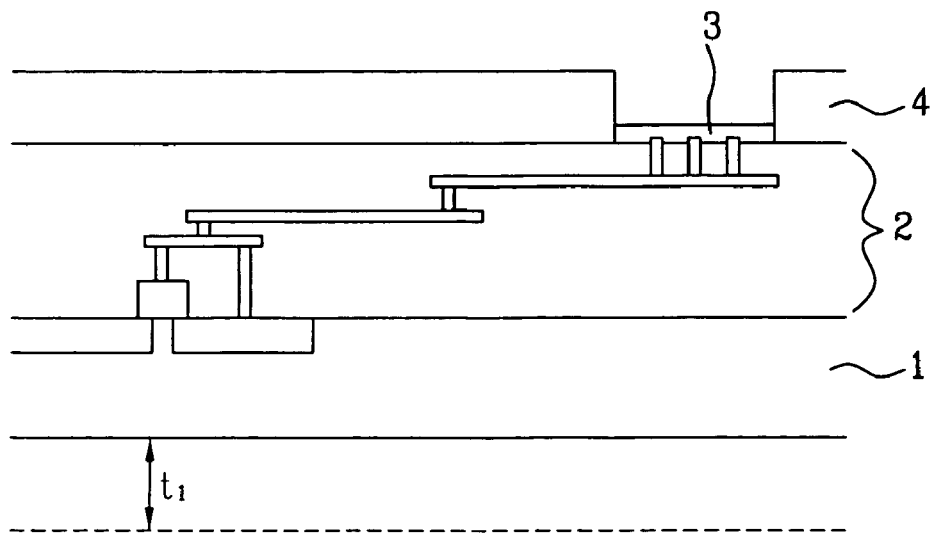
Figure 1E:
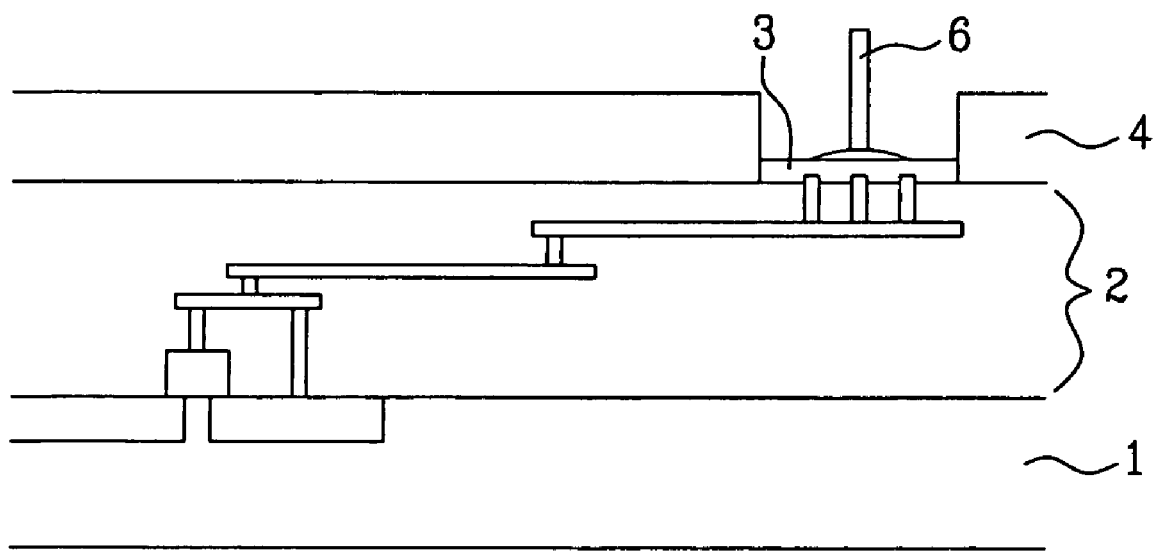
Figure 2A:
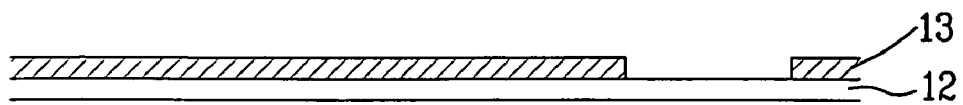
FIG. 2A to FIG. 2G are cross sectional views of the fabrication process for a semiconductor device according to an exemplary embodiment of the present invention.
Figure 2B:
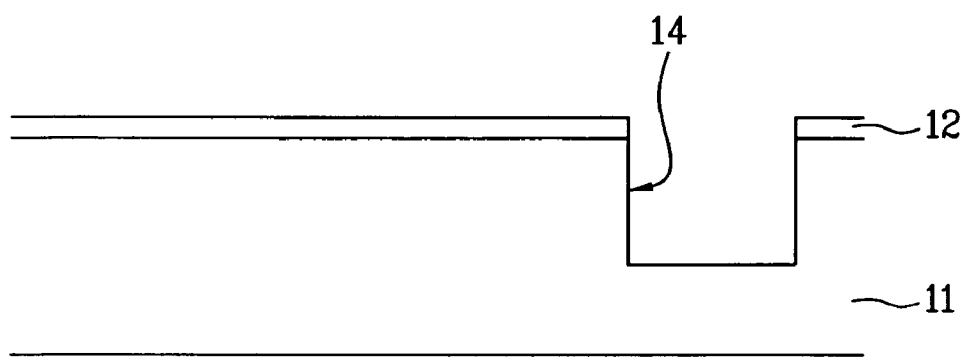
Figure 2C:
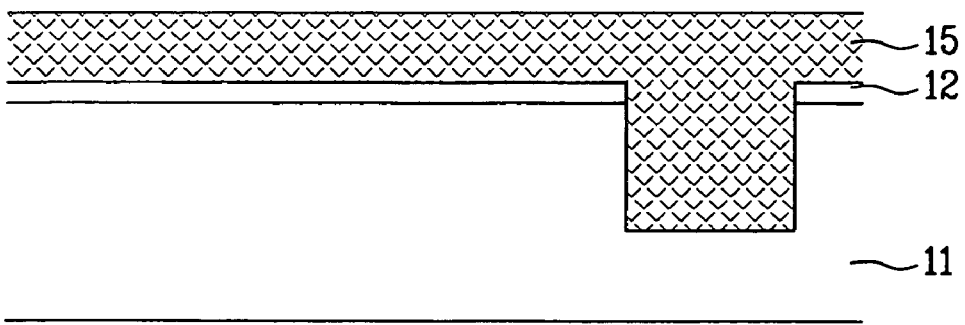
Figure 2D:
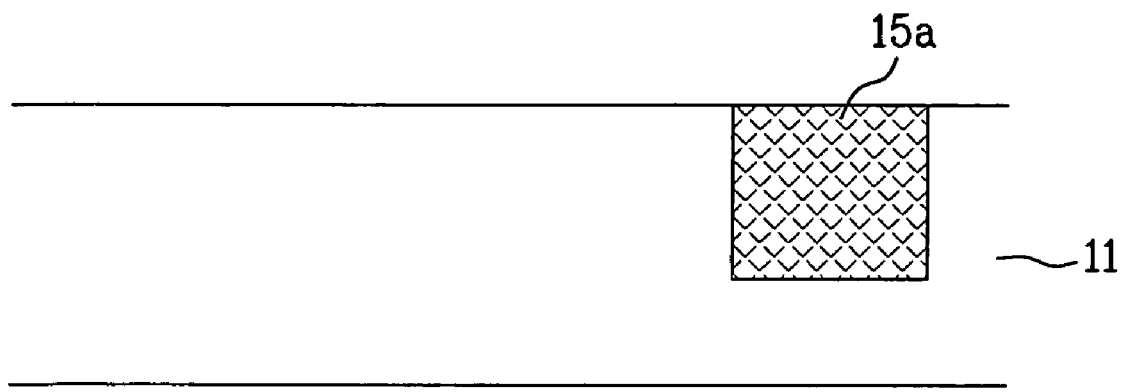
Figure 2E:
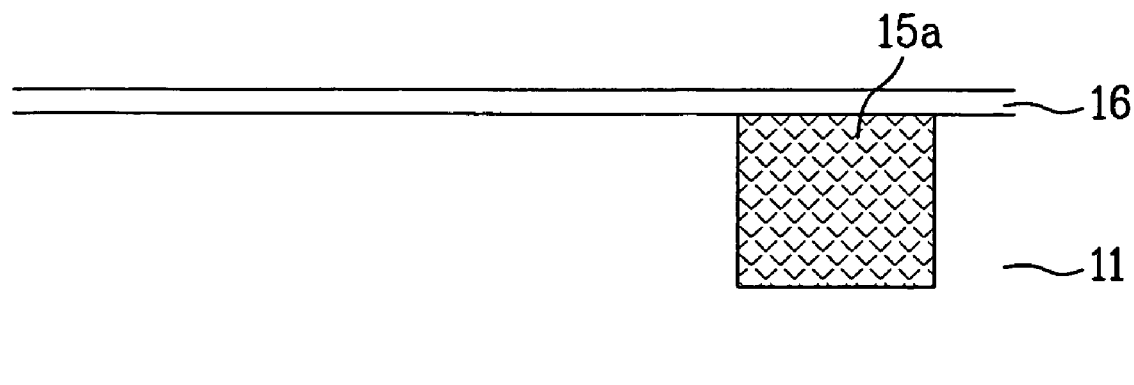
Figure 2F:
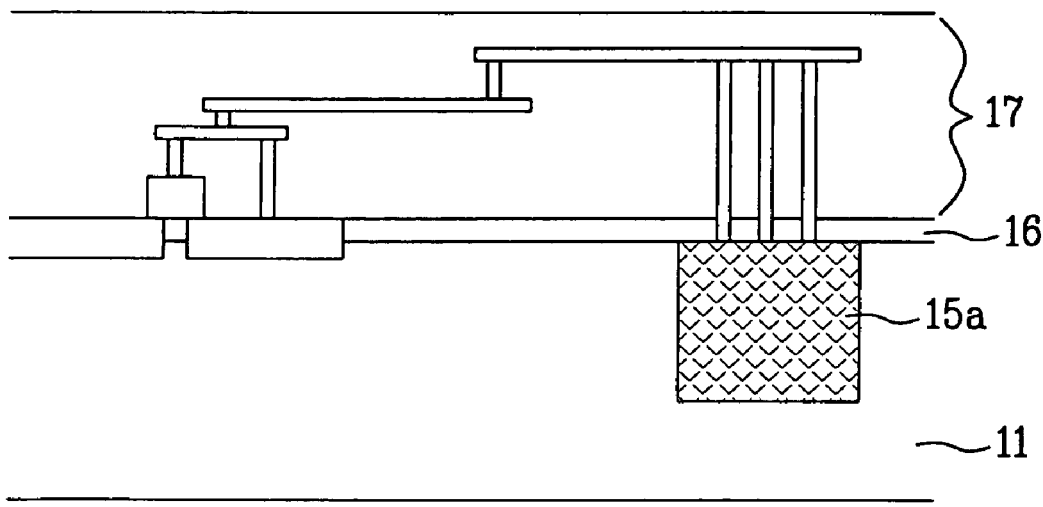
Figure 2G:
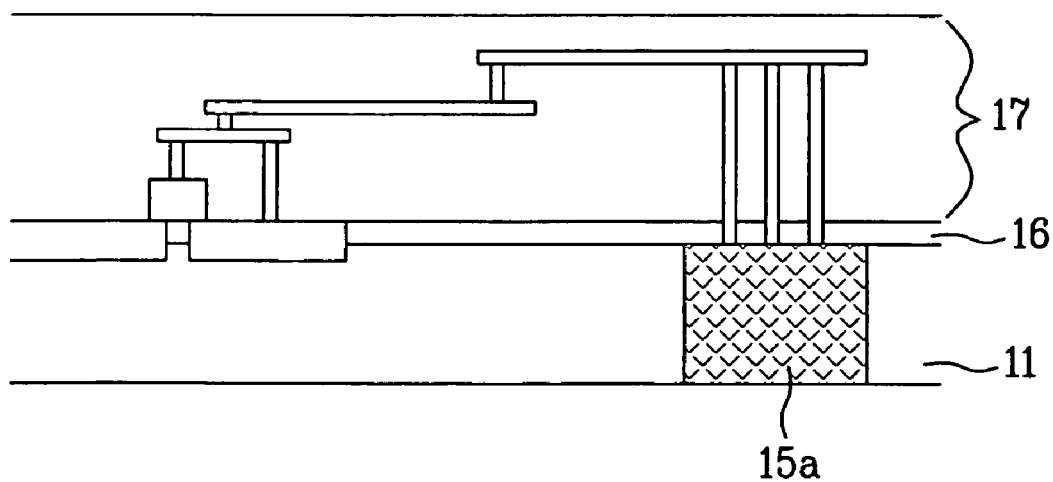

FIG. 2G is a cross sectional view of a semiconductor device according to one preferred embodiment of the present invention. As shown in FIG. 2G, structures 17 including circuit devices and metal wires are formed on a front surface of a semiconductor substrate 11. An electrode pad 15a is exposed in a rear surface of the semiconductor substrate 11. The electrode pad 15a is connected to the structures 17 through the metal wire.

A depression is formed in a front surface of the semiconductor substrate 11 filled with a metal material. A predetermined thickness of the rear surface of the semiconductor substrate 11 is removed to expose the electrode pad 15a in the rear surface of the semiconductor substrate 11.

In one exemplary embodiment, the electrode pad 15 is exposed by performing a chemical mechanical polishing (CMP) process on the rear surface of the semiconductor substrate 11. The CMP process is performed until the electrode pad has the same height as the rear surface of the semiconductor substrate 11.

A method for fabricating the semiconductor device will be described in detail.

FIG. 2A to FIG. 2G are cross sectional views of the fabrication process for a semiconductor device according to an exemplary embodiment of the present invention.

As shown in FIG. 2A, in order to form the depression in the semiconductor substrate 11, an oxide layer 12 is formed on an entire front surface of the semiconductor substrate 11. A photoresist pattern 13 for exposing the portion corresponding to the electrode pad 15 is formed by photolithography.

As shown in FIG. 2B, the exposed oxide layer 12 and the semiconductor substrate 11 thereunder are etched at a predetermined depth by using the photoresist pattern 13 as a mask, thereby forming the depression 14. The depression 14 may be formed by a plasma etching method or a wet etching method. The depression may be formed by etching the semiconductor substrate 11 until the depression 14 has a depth of about 300 μm to about 600 μm. The photoresist pattern 13 is removed.

As shown in FIG. 2C, a metal material 15 is coated at a thickness suitable for filling the depression 14. The metal material 15 may be formed of any conductive material such as aluminum (Al) or gold (Au). The metal material 15 is used for the electrode pad 15a.

As shown in FIG. 2D, the metal material 15 is chemically and mechanically polished until the semiconductor substrate 11 is exposed. The metal material 15 filled in the depression 14 remains. The metal material 15 remaining in the depression 14 serves as the electrode pad 15a.

As shown in FIG. 2E, a protective layer 16 is formed on the entire front surface of the semiconductor substrate 11 so as to protect the electrode pad. The protective layer 16 may be formed of any insulating material, for example, an oxide layer.

As shown in FIG. 2F, the structures 17 including various circuit devices and metal wires for electrically connecting the circuit devices with one another are formed on the front surface of the semiconductor substrate 11.

As shown in FIG. 2G, the rear surface of the semiconductor substrate 11 is chemically and mechanically polished until the electrode pad 15a is exposed. This causes the surface of the electrode pad 15a to be in the same plane as the rear surface of the semiconductor substrate 11.

The electrode pad 15a is electrically bonded to a lead frame. A packaging process is performed thereto. Herein, the various packaging process may be applied. For example, a process of using a wire bonding, a flip chip, or a bump may be applied.

Conventionally, "chip level packaging" is generally performed in which a wafer is sawed into chips, and the individual chips are packaged. However, in a recent trend toward a thin and light package, "wafer level packaging" is performed, wherein a wafer is packaged, and completed products are individually sawed. This wafer level packaging has more simplified fabrication process than the chip level packaging. Also, the size of package is same as the size of chip, whereby it is suitable for fabricating small-sized electronic equipment.

The fabricated device according to the present invention may be packaged in this wafer level packaging.

Also, in a related art structure of exposing the electrode pad on the uppermost metal wire, the electrode pad is formed outermost so as to prevent the metal wires from overlapping. Accordingly, the electrode pad is formed in the outermost portion of an active region. However, in case of a structure according to the present invention, the depression for the electrode pad is formed in the wafer of the portion below the uppermost metal wire. Thus, it is not required to form the electrode pad in the outermost portion of the active region. Accordingly, it is possible to decrease the size of chip as compared with the related art chip.

The backlight unit according to the present invention may be applied without regard to the kind of device or packaging.

As mentioned above, the backlight unit and the method for fabricating the same according to the present invention have the following advantages.

In the backlight unit according to the present invention, the electrode pad is exposed by chemically and mechanically polishing the rear surface of the semiconductor substrate, whereby it is possible to prevent the electrode pad form being contaminated.

By using the backlight unit according to the present invention, it is possible to fabricate small-sized electronic equipment, thereby reducing the fabrication cost.

Korean Patent Application No. P2004-73723, filed on Sep. 15, 2004, is hereby incorporated by reference in its entirety.

It will be apparent to those skilled in the art that various modifications and variations can be made in the present invention. Thus, it is intended that the present invention covers the modifications and variations of this invention within the scope of the appended claims and their equivalents.

What is claimed is:

1. A method for fabricating a semiconductor device comprising:
   forming a depression in a front surface of a semiconductor substrate;
   forming a metal material layer on the semiconductor substrate that fills the depression;
   forming an electrode pad within the depression by chemical and mechanically polishing the metal material layer;
   forming a protective layer of an insulating material for the electrode pad on the surface of the semiconductor substrate after forming the electrode pad within the depression;
   forming structures including circuit devices and metal wires on the front surface of the semiconductor substrate; and
   exposing the electrode pad by removing a rear surface of the semiconductor substrate.

2. The method of claim 1, wherein the step of forming the depression includes forming the depression with a depth of about 300 μm to about 600 μm.

3. The method of claim 1, wherein the step of exposing the electrode pad includes chemically and mechanically polishing the rear surface of the semiconductor substrate until the electrode pad is exposed to cause the surface of the electrode pad to be in a same plane as the rear surface of the semiconductor substrate.

4. A method for fabricating a semiconductor device comprising:
   a step for forming a depression in a front surface of a semiconductor substrate;
   a step of forming a metal material layer on the semiconductor substrate that fills the depression;
   a step for forming an electrode pad within the depression by chemical and mechanically polishing the metal material layer;
   a step of forming a protective layer of an insulating material for the electrode pad on the surface of the semiconductor substrate after forming the electrode pad within the depression;
   a step for forming structures including circuit devices and metal wires on the front surface of the semiconductor substrate; and
   a step for exposing the electrode pad by removing a rear surface of the semiconductor substrate.

5. The method of claim 4, wherein the step for forming the depression includes a step for forming the depression with a depth of about 300 μm to about 600 μm.

6. The method of claim 4, wherein the step for exposing the electrode pad includes a step for chemically and mechanically polishing the rear surface of the semiconductor substrate until the electrode pad is exposed to cause the surface of the electrode pad to be in a same plane as the rear surface of the semiconductor substrate.

7. The method of claim 1, wherein forming an electrode pad further comprises forming a front surface of an electrode pad on the front surface of the semiconductor substrate by chemically and mechanically polishing the metal material layer to expose the front surface of the semiconductor substrate.

8. The method of claim 1, wherein forming a protective layer of an insulating material further comprises forming the protective layer of an insulating material prior to forming the structures including circuit devices and metal wires on the front surface of the semiconductor substrate.

9. The method of claim 1, wherein forming structures further comprises forming structures including circuit devices and metal wires on the front surface of the semiconductor substrate and on the protective layer of an insulating material.

10. The method of claim 1, wherein exposing the electrode pad further comprises exposing a rear surface of the electrode pad by chemically and mechanically polishing a rear surface of the semiconductor substrate.

11. The method of claim 10, wherein exposing the rear surface of the electrode occurs after forming the structures including circuit devices and metal wires on the front surface of the semiconductor substrate.

* * * * *